US008085544B2

(12) United States Patent
Zhao

(10) Patent No.: US 8,085,544 B2
(45) Date of Patent: Dec. 27, 2011

(54) DATA CARD

(75) Inventor: Shuai Zhao, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 13/090,856

(22) Filed: Apr. 20, 2011

(65) Prior Publication Data

US 2011/0188211 A1 Aug. 4, 2011

Related U.S. Application Data

(63) Continuation of application No. 12/470,252, filed on May 21, 2009.

(30) Foreign Application Priority Data

May 22, 2008 (CN) ...................... 2008 2 0114883 U

(51) Int. Cl.
*H05K 1/14* (2006.01)

(52) U.S. Cl. .............. 361/737; 361/679.21; 361/679.32; 361/727; 361/752; 439/79; 439/135; 439/136; 439/159; 439/638; 348/725; 365/52; 343/702; 235/441

(58) Field of Classification Search .................. 361/737, 361/679.21, 679.32, 752, 727; 439/79, 135, 439/136, 159, 638; 348/725; 365/52; 343/702; 235/441
See application file for complete search history.

(56) References Cited

U.S. PATENT DOCUMENTS

| | | | | |
|---|---|---|---|---|
| 6,561,421 | B1 * | 5/2003 | Yu | 235/451 |
| 6,758,689 | B1 | 7/2004 | Bair et al. | |
| 7,416,424 | B1 * | 8/2008 | Deckman | 439/135 |
| 7,530,823 | B1 * | 5/2009 | Thornton et al. | 439/136 |
| 7,551,450 | B2 * | 6/2009 | Sugawara et al. | 361/752 |
| 7,586,460 | B2 * | 9/2009 | Hunt et al. | 343/882 |
| 7,737,895 | B2 * | 6/2010 | Sanchez et al. | 343/702 |
| 2004/0038565 | A1 * | 2/2004 | Yen | 439/79 |
| 2004/0042323 | A1 * | 3/2004 | Moshayedi | 365/232 |
| 2004/0087213 | A1 * | 5/2004 | Kao | 439/638 |
| 2005/0070138 | A1 * | 3/2005 | Chiou et al. | 439/76.1 |
| 2005/0130469 | A1 | 6/2005 | Ikenoue | |
| 2005/0182881 | A1 * | 8/2005 | Chou et al. | 710/301 |

(Continued)

FOREIGN PATENT DOCUMENTS

EP 2254201 B1 5/2011

OTHER PUBLICATIONS

Extended European Search Report in corresponding European Application No. 11158445.4 (Jul. 13, 2011).

(Continued)

*Primary Examiner* — Xiaoliang Chen
(74) *Attorney, Agent, or Firm* — Leydig, Voit & Mayer, Ltd.

(57) ABSTRACT

A data card includes a casing, a circuit board in the casing, a plug electrically connected with the circuit board and a cap part capable of covering the plug; wherein one end of the casing is provided with the plug; a card slot is defined in the casing at a joint of the casing and the plug, and the cap part covers a notch of the card slot when the plug is inserted into the cap part. The invention is mainly used in wireless data signal receiving or transmitting device.

4 Claims, 7 Drawing Sheets

U.S. PATENT DOCUMENTS

| | | | | |
|---|---|---|---|---|
| 2005/0247796 | A1* | 11/2005 | Chen | 235/492 |
| 2006/0046544 | A1* | 3/2006 | Ujii et al. | 439/159 |
| 2006/0082963 | A1* | 4/2006 | Chen | 361/684 |
| 2006/0112209 | A1* | 5/2006 | Yao | 710/301 |
| 2006/0205258 | A1 | 9/2006 | Cho et al. | |
| 2006/0208066 | A1* | 9/2006 | Finn et al. | 235/380 |
| 2006/0232922 | A1* | 10/2006 | Tong | 361/685 |
| 2007/0011372 | A1* | 1/2007 | Wang | 710/62 |
| 2007/0103880 | A1* | 5/2007 | Feng et al. | 361/796 |
| 2007/0259570 | A1* | 11/2007 | Moshayedi | 439/638 |
| 2007/0274117 | A1* | 11/2007 | Salazar et al. | 365/52 |
| 2008/0067248 | A1* | 3/2008 | Hiew et al. | 235/441 |
| 2008/0096413 | A1 | 4/2008 | Chen | |
| 2008/0166920 | A1* | 7/2008 | Johnson et al. | 439/638 |
| 2008/0191033 | A1* | 8/2008 | Cuellar et al. | 235/492 |
| 2008/0192149 | A1* | 8/2008 | Lee | 348/725 |
| 2008/0248692 | A1* | 10/2008 | Ni et al. | 439/607 |
| 2008/0305650 | A1* | 12/2008 | Chen | 439/62 |
| 2009/0019224 | A1* | 1/2009 | Pocrass | 711/115 |
| 2009/0172279 | A1* | 7/2009 | Yuan et al. | 711/115 |

OTHER PUBLICATIONS

Extended European Search Report in corresponding European Application No. 10173063.8 (Oct. 21, 2010).

Image File Wrapper in corresponding U.S. Appl. No. 12/470,252 (Aug. 17, 2011).

* cited by examiner

DATA CARD

CROSS-REFERENCE TO RELATED APPLICATIONS

This is a continuation of U.S. application Ser. No. 12/470,252, filed on May 21, 2009, which claims priority to Chinese Patent Application No. 200820114883.9, filed May 22, 2008, both of which are hereby incorporated by reference in their entireties.

FIELD OF THE INVENTION

The present invention relates to a data transfer device and, in particular, to a data card.

DESCRIPTION OF THE RELATED ART

At present, a conventional data card mainly includes a wireless network card, wireless access-internet card, and other such wireless network devices. The wireless network card is a signal transceiver, which is similar to a typical computer network card in role and function. The connection of a computer to the Internet can be achieved when the wireless network card plugged into the computer finds an access to the Internet. The wireless access-internet card is equivalent to a wired modem in role and function. In any region covered by radiophone signals, the connection of appliances to the Internet can be achieved by the wireless access-internet card with a SIM Card (Subscriber Identity Model Card) in the wireless access-internet card.

With the developing of the technology of wireless communication terminals and data cards, the data card is continually enhanced and integrated in function, and reduced in volume. For example, the volume of existing Universal Serial BUS (USB) data card shown in FIG. 1 has almost been reduced to a minimum limit with hardware solutions and unchanged device packaging. The data card configured as the wireless network card includes a casing 1 and a circuit board provided in the casing. One end of the casing 1 is provided with a plug 2, while the other end is provided with a hollow shell-like antenna 6. The circuit board is electrically connected with the plug 2 and the antenna 6, respectively. The plug 2 is inserted into a cap 3 having a rope 8. The hollow shell-like antenna 6 has a larger surface area, and the hollow shell-like antenna 6 having the larger surface area can receive signals of wider frequency range. The rope 8 on the cap 3 is configured for the convenience of carrying the data card by user. The user carries the data card by putting the rope over his/her neck or arm.

The data card configured as the wireless access-internet card is substantially similar to the data card configured as the wireless network card in structure, with the difference in that the larger side of the casing of the wireless access-internet card is further provided with a card slot electrically connected with the circuit board. The circuit board has the function of reading and identifying the data information of the SIM card. In order to go online, the SIM card provided with network service is inserted into the card slot, and the plug is plugged into a jack of computer. Then, the circuit board reads the data information of the SIM Card through the card slot and connects to the wireless network, and thereby the computer becomes able to go online.

However, the conventional data card at least has the following problems: although the hollow shell-like antenna increases the surface area of the antenna, the volume of the data card is also increased significantly, which causes problems such as being inconvenient to carry, consuming additional materials, etc.

SUMMARY OF THE INVENTION

An embodiment of the invention provides a data card with reduced volume. To achieve smaller volume, the data card of the embodiment of the invention employs the following solution. The data card includes a casing provided with a circuit board therein, where one end of the casing is provided with a plug electrically connected with the circuit board, and the data card further includes a connecting part and a cap part. One end of the connecting part is connected with the casing, while the other end is connected with the cap part. The cap part can cover the plug. The connecting part and/or the cap part are/is provided with an antenna electrically connected with the circuit board.

Differing from the conventional art, in the embodiment of the invention, the antenna is provided on the connecting part and/or the cap part. Because the portion of the cap part which can cover the plug is hollow shell-like and the connecting part is connected with both the casing and the cap part, the surface area of the cap part and the connecting part is larger. Therefore, not only the cap part in the current application may function as providing protection of the plug as in the conventional cap, but also that either the cap part or the connecting part of the current application can ensure a sufficiently large surface area for the antenna and the signal which can be received by the antenna having a wider frequency range, thereby saving the space occupied by the conventional hollow shell-like antenna.

DETAILED DESCRIPTION

Embodiments of the invention, which address the problem of the large volume associated with conventional data cards, are described in detail in connection with the drawings.

Embodiment 1

Figure 1:
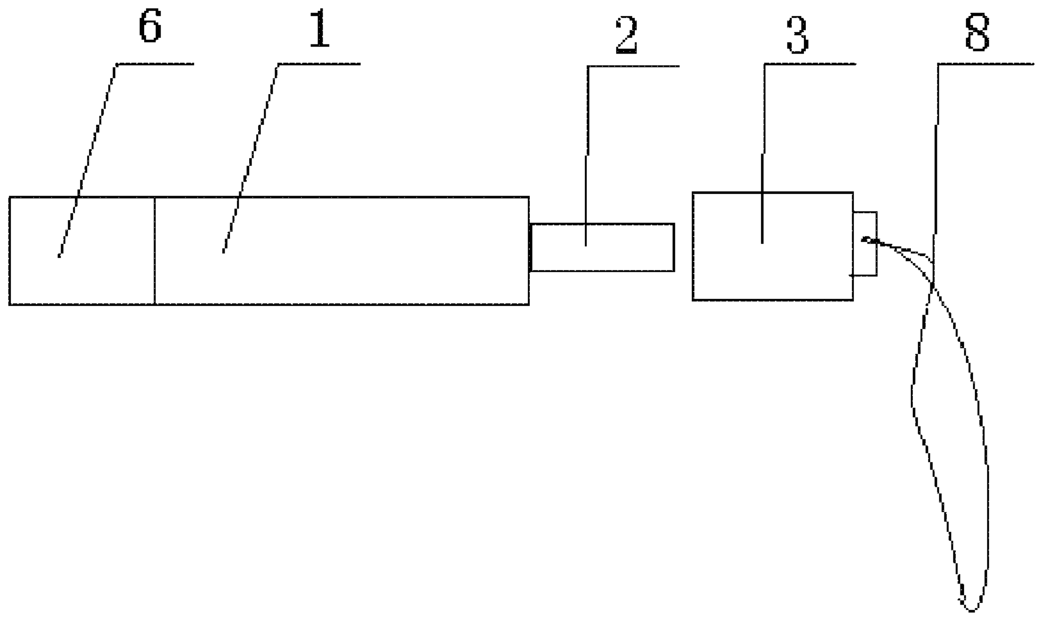
FIG. 1 is a structural schematic view of a conventional USB data card.
Figure 2:
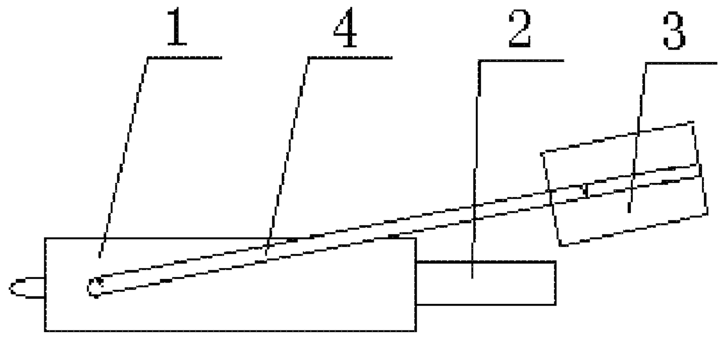
FIG. 2 is a structural schematic view of a data card, according to embodiment 1 of the invention.
Figure 3:
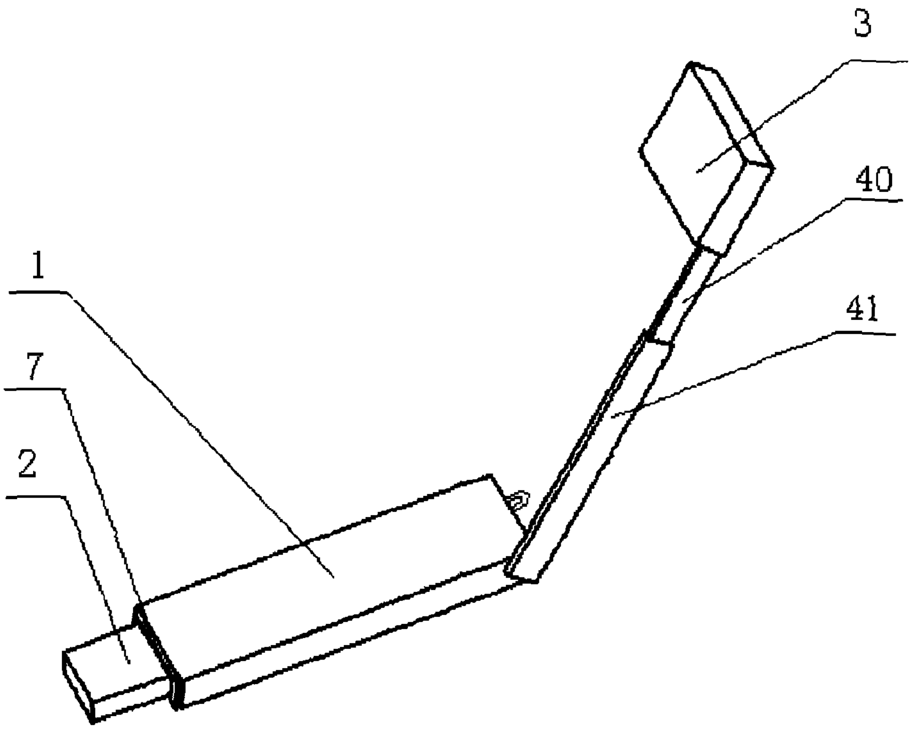
FIG. 3 is a perspective schematic view showing a data card, according to one example of embodiment 1 of the invention, in a state that a cap part is pulled out from a connecting part.

As shown in FIGS. 2 and 3, the data card of the embodiment of the invention includes a casing 1, provided with a circuit board therein. One end of the casing 1 is provided with a plug 2 electrically connected with the circuit board. The data card of the embodiment of the invention further includes a connecting part 4 and a cap part 3.

One end of the connecting part 4 is connected with the casing 1, while the other end is connected with the cap part 3. The cap part 3 can cover the plug 2. An antenna which is electrically connected with the circuit board is provided on the connecting part 4 and/or the cap part 3.

In the embodiment of the invention, the antenna may be electrically connected to the circuit board in various manners, for example, through the connecting part 4 and/or the cap part 3, or through the combination of the cap part 3 and a wire. It is understood that the connecting part 4 may employ a wire. The cap part 3 can cover the plug 2 by insertion, socket, or slide connection, or in a similar manner.

In this embodiment, the antenna is provided on the connecting part 4 and the cap part 3. It is understood that the antenna may be provided on one of the connecting part 4 and the cap part 3 only. Since the portion of the cap part 3 which covers the plug 2 is hollow shell-like, the connecting part 4 can be configured to have a larger surface area. Therefore, not only can the cap part 3 can function as providing a protection of the plug 2 as done in the conventional cap and the connecting part 4 can function as providing a connection of the casing 1 with the cap part 3, but the antenna may be provided on cap part 3 and/or connecting part 4 such that the antenna can have a sufficiently large surface area and the signal which can be received by the antenna may have a wider frequency range, thereby saving the space occupied by the prior hollow shell-like antenna.

Figure 7:
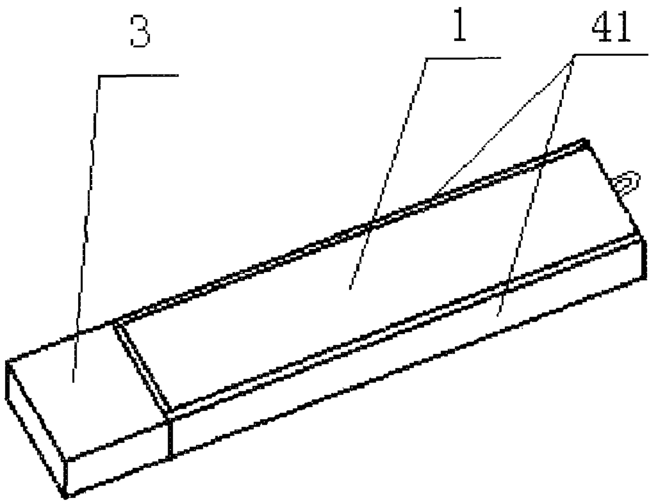
FIG. 7 is a perspective schematic view showing the data card, according to another example of embodiment 1 of the invention, as shown in FIG. 4, in a state that the plug has been inserted into the cap part.

In the embodiment of the invention, the casing 1 has a rectangular parallel-piped shape, the plug 2 is a USB plug, and the USB plug 2 is arranged at a smaller side of the casing 1. The connecting part 4 includes a guide rod 40 and a guide rail 41. One end of the guide rail 41 is movably connected with the casing 1, the other end of the guide rail 41 is connected with one end of the guide rod 40 in insertion, socket, or slide connection manner, and the other end of the guide rod 40 is connected with the cap part 3. The other end of the guide rod 40 may be connected to the cap part 3 in various forms. The other end of the guide rod 40 may be fixedly connected to the cap part 3, or may be connected to the cap part 3 in insertion, socket, or slide connection manner. In this embodiment, the guide rod 40 is inserted into the guide rail 41, and the guide rail 41 can slide along the guide rod 40. As shown in FIG. 7, the cap part 3 can cover the plug 2 by sliding the guide rail 41 along the guide rod 40. In this embodiment, each of the casing 1, the connecting part 4 and the cap part 3 are coated with insulation material, which has the effect of preventing the above components from wearing and avoiding short circuit with external circuit.

Figure 4:
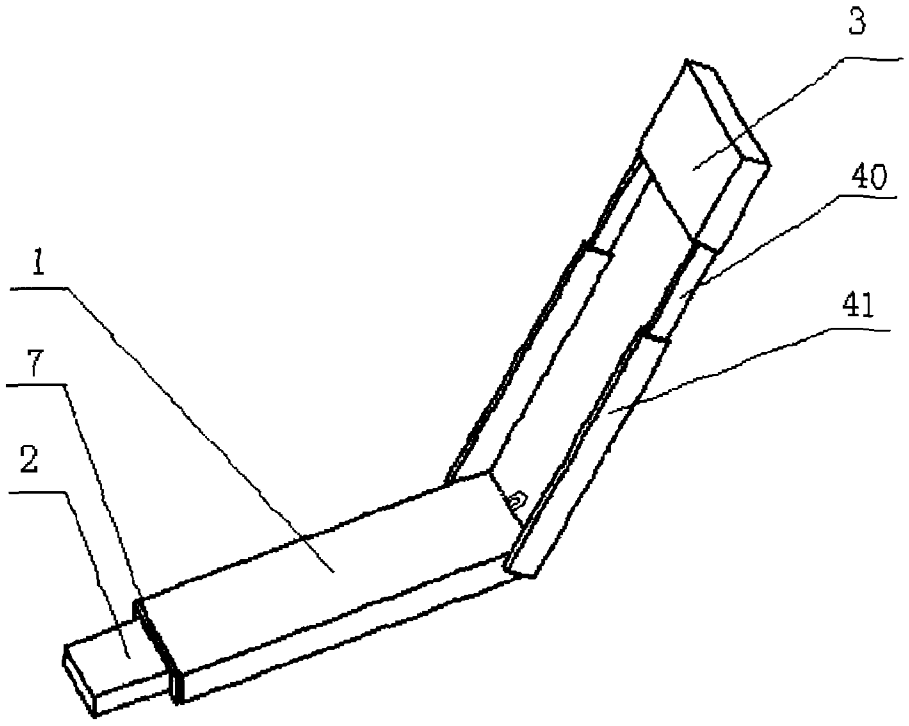
FIG. 4 is a perspective schematic view showing a data card, according to another example of embodiment 1 of the invention, in a state that a cap part is pulled out from a connecting part.
Figure 5:
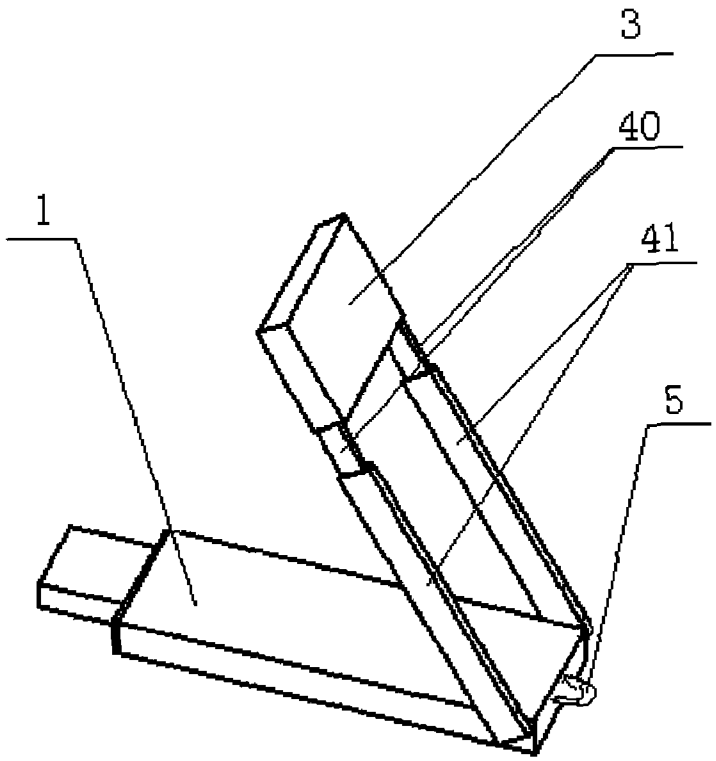
FIG. 5 is a perspective schematic view showing the data card, according to another example of embodiment 1 of the invention, as shown in FIG. 4, in a state that the cap part is being folded.
Figure 6:
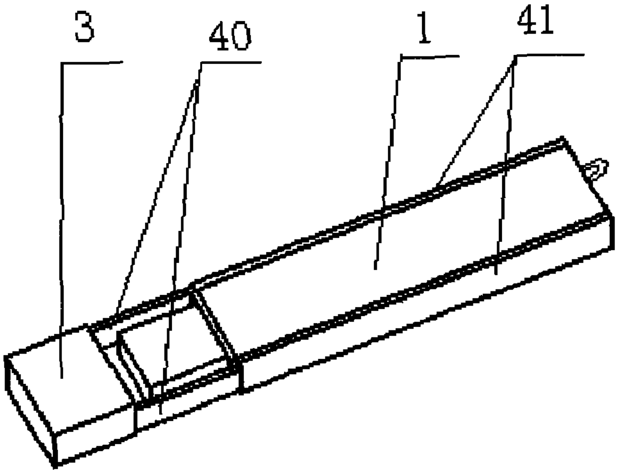
FIG. 6 is a perspective schematic view showing the data card, according to another example of embodiment 1 of the invention, as shown in FIG. 4, in a state that the cap part has been folded.
Figure 8:
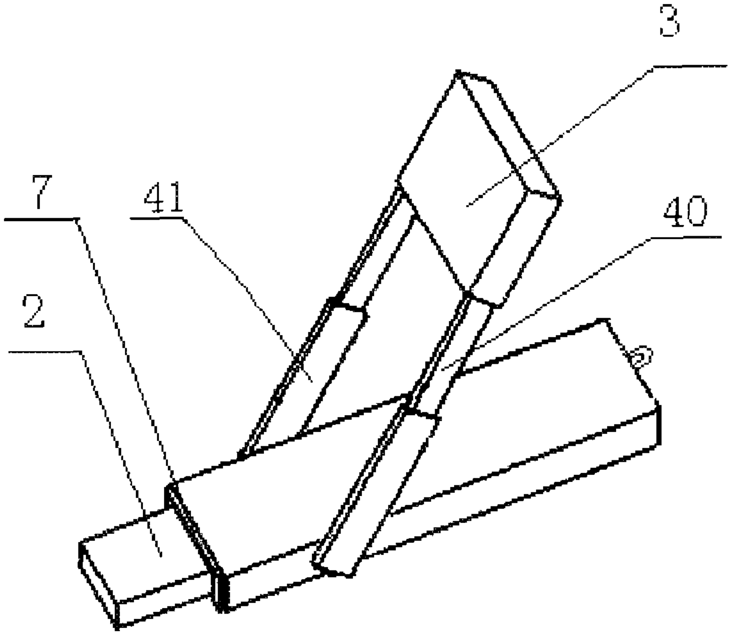
FIG. 8 is a perspective schematic view showing a data card, according to a further example of embodiment 1 of the invention, in a state that a cap part is being folded.

As shown in FIGS. 4, 5, and 6, as a modification of the embodiment of the invention, one end of the guide rail 41 may be pivotally connected to the casing 1 at an end of the casing 1 distal to the plug 2. Also, as shown in FIG. 8, the guide rail 41 may be pivotally connected to the casing 1 at an end of the casing 1 proximal to the plug 2. The farther the pivotal connection position spaces apart from the plug 2, the longer the guide rod 40 and the guide rail 41 are, and the larger the working space of the guide rail 41, the guide rod 40, and the cap part 3 thereon are. Additionally, this provides the possibility of adjusting an orientation and a position of the antenna to have a larger antenna gain and a better signal receiving effect will be increased.

As a further modification of the embodiment of the invention, both the guide rod 40 and the guide rail 41 may include two guide rod elements parallelly and symmetrically arranged on both sides of the casing 1, respectively. Each of the symmetrically arranged guide rod 40 and the guide rail 41 has a more uniform stress and a higher reliability, as well as having a better appearance.

As a further modification of the embodiment of the invention, the antenna of the data card may include a main antenna and a diversity antenna. Wireless data signals are received or transmitted mainly through the main antenna, and the diversity antenna functions as an auxiliary receiver. In the embodiment, the main antenna and the diversity antenna may be arranged in the following alternative arrangements: (1) The main antenna is arranged on the cap part 3, and the diversity antenna is arranged on the connecting part 4, wherein the diversity antenna may be arranged on any one element of the guide rod 40 or any one element of the guide rail 41; (2) The main antenna is arranged on one element of the guide rod 40 or one element of the guide rail 41, and the diversity antenna is arranged on the other element of the guide rod 40 or the other element of the guide rail 41; or (3) The main antenna and the diversity antenna may also be arranged on any one element of the guide rod 40 or any one element of the guide rail 41, respectively, and the diversity antenna may also be directly arranged on the circuit board. The main antenna and the diversity antenna can be electrically connected with the circuit board located within the casing 1 through the guide rod 40 or the guide rail 41. The circuit board can rectify the signal received by the main antenna by use of the signal received by the diversity antenna, so as to enhance the sharpness of the signal received.

As a further modification of the embodiment of the invention, the casing 1 is provided with a rope structure. In the embodiment, the rope structure is arranged at an end of the casing 1 distal to the plug 2, specifically, in a hole 5 or a hook provided to the casing 1 or a groove defined in the end of the casing 1 distal to the plug 2. The rope can be socketed or banded to the hole 5, the hook or the groove so as to make the carry of the data card safer. The data card will not be lost, even if the cap part 3 is dropped off or damaged.

Figure 13:
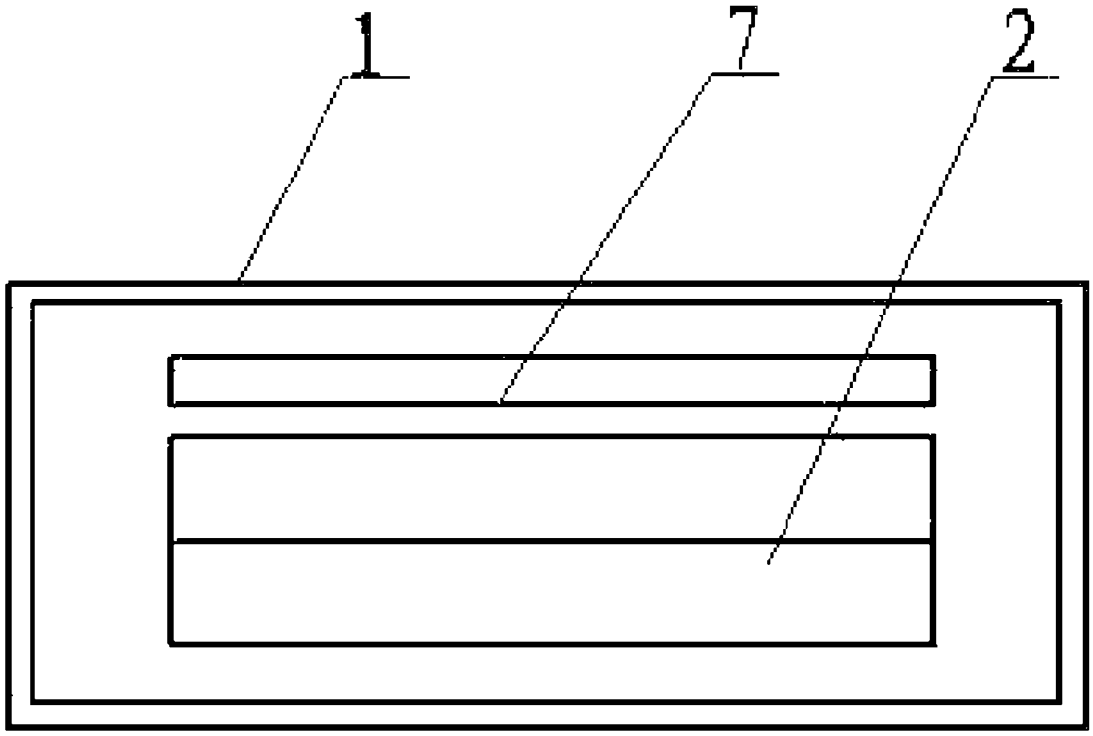
FIG. 13 is a schematic view showing a position of a card slot in a data card, according to an embodiment of the invention.

As a further modification of the embodiment of the invention, for the data card which can achieve network connection only if the SIM Card has been used, in the embodiment of the invention, a card slot for receiving the SIM is defined in the casing 1 at a joint of the casing 1 and the plug 2, as shown in FIG. 13. The cap can cover a notch of the card slot when the plug 2 is inserted into the cap. After the SIM card is inserted into the card slot, the plug 2 is inserted into the cap. Then, the cap covers the notch of the card slot while covering the plug 2, thereby providing a protection of the SIM card at the same time.

Embodiment 2

Figure 9:
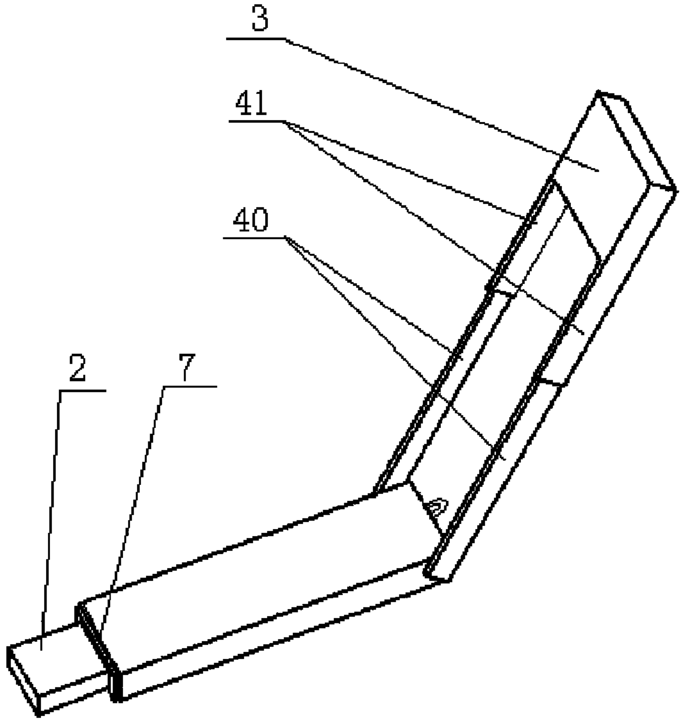
FIG. 9 is a perspective schematic view showing a data card, according to embodiment 2 of the invention, in a state that a cap part is being folded.

Shown in FIG. 9 is another embodiment of the invention, which differs from embodiment 1 in that, in this embodiment, the connecting part 4 includes the guide rail 41 and the guide rod 40, one end of the guide rod 40 is movably connected with the casing 1, the other end of the guide rod 40 is connected with one end of the guide rail 41 in socket or insertion connection, and the other end of the guide rail 41 is connected with a cap part 3. Therefore, the cap part 3 can slide along the guide rod 40 to cover the plug 2.

In this embodiment, the position of the guide rail 41 and the guide rod 40 can be adjusted by sliding the cap part 3 along the guide rod 40 or by means of the guide rod 40 and the movable joint, thereby the antenna can be adjusted to an orientation and a position at which the antenna gain is higher and the signal receiving effect is better.

Embodiment 3

Figure 10:
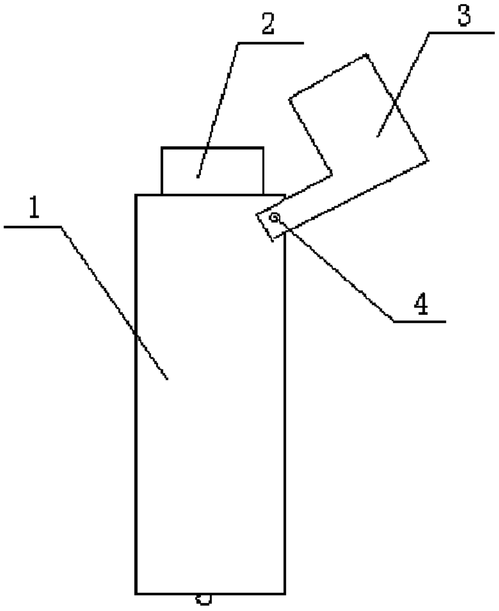
FIG. 10 is a perspective schematic view showing a data card, according to embodiment 3 of the invention, in a state that a cap part is turned out.

FIG. 10 shows embodiment 3 of the invention, which differs from embodiment 1 in that, in this embodiment, the connecting part 4 is a pivot shaft, the cap part 3 is pivotally connected to a casing 1 through the pivot shaft, and the cap part 3 rotates about the pivot shaft to cover the plug 2. In this embodiment, the main antenna is arranged in the cap part 3, and the diversity antenna is arranged on the pivot. It is understood that the diversity antenna can be arranged on the circuit board or the casing 1. The antenna can be adjusted to an orientation and a position at which the antenna gain is higher and signal receiving effect is better by rotating the cap part 3.

Embodiment 4

Figure 11:
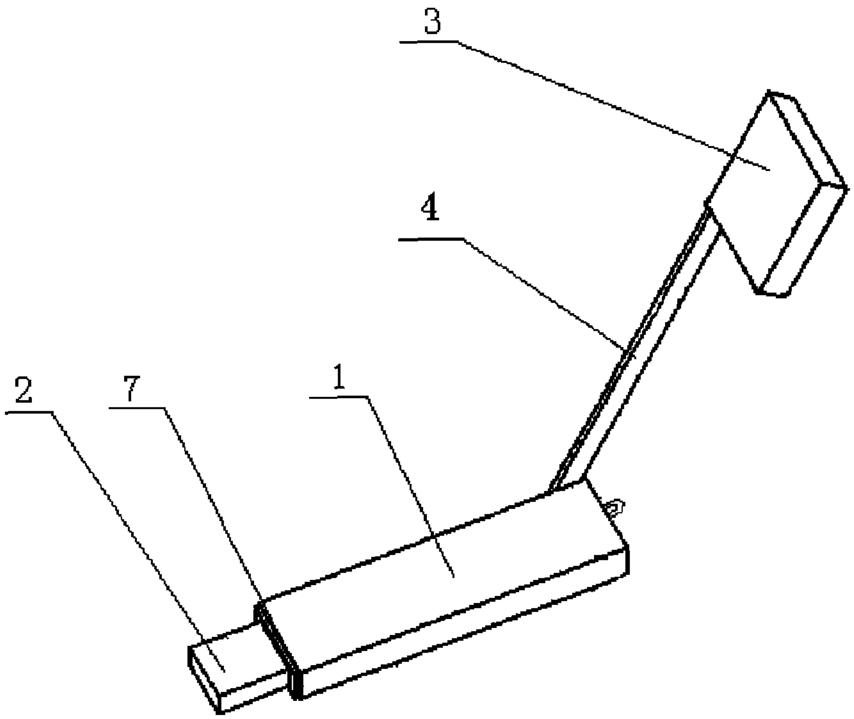
FIG. 11 is a perspective schematic view showing a data card, according to one example of embodiment 4 of the invention, in a state that a cap part is pulled out.

FIG. 11 shows embodiment 4 of the invention, which differs from embodiment 1 in that, in embodiment 4, the connecting part 4 is a guide rod 40, one end of which is movably connected with a casing 1, and the other end of which is connected with the cap part 3 through a guide slot defined on a side of the cap part 3. In this embodiment, the movable connection of one end of the guide rod 40 with the casing 1 is a pivot connection, and the other end of the guide rod 40 is inserted into a guide slot defined inside the cap part 3. It is understood that the guide slot can be provided outside the cap part 3. The cap part 3 can slide along the guide rod 40 to cover a plug 2.

Figure 12:
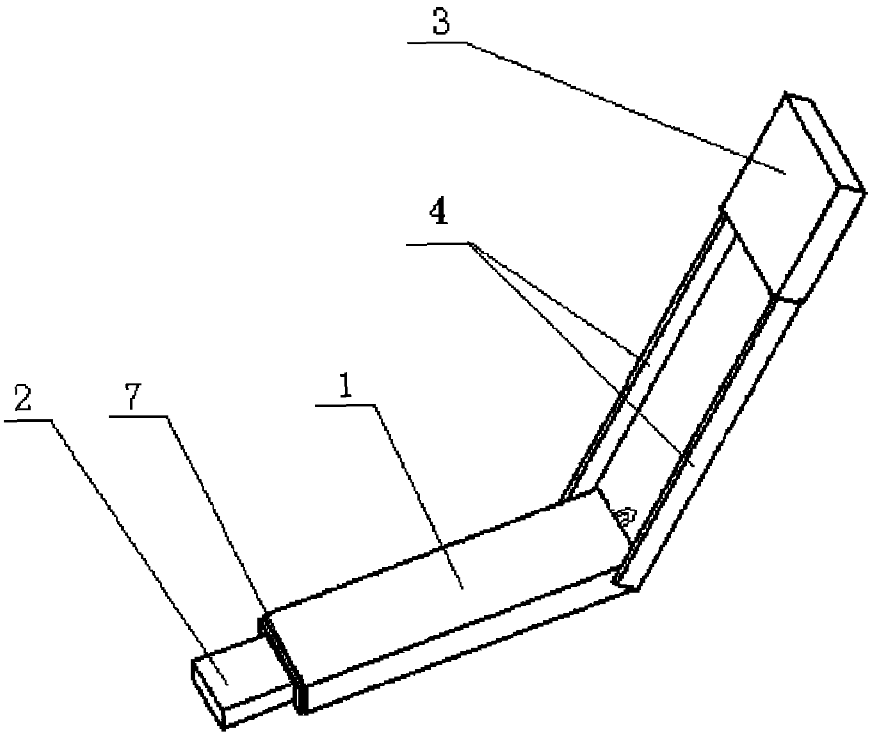
FIG. 12 is a perspective schematic view showing a data card, according to another example of embodiment 4 of the invention, in a state that the cap part is pulled out.

As shown in FIG. 12, as an improvement of this embodiment, the guide rod 40 can also include two guide rod elements symmetrically arranged on both sides of the casing 1. In this embodiment, the main antenna and the diversity antenna are arranged on the cap part 3 and the guide rod 40, respectively. In the case of the guide rod 40 including two guide rod elements, the main antenna and the diversity antenna may be provided on the two guide rod elements 40, respectively. The antenna can be adjusted to an orientation and a position at which the antenna gain is higher and signal receiving effect is better by rotating the guide rod 40 or sliding the cap part 3 along the guide rod 40 to adjust the position of the antenna.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A data card, comprising:

a casing;

a circuit board in the casing;

a plug electrically connected with the circuit board; and a cap part capable of covering the plug;

wherein one end of the casing is provided with the plug;

a card slot is defined in the casing at a joint of the casing and the plug, and the cap part covers a notch of the card slot when the plug is inserted into the cap part;

the data card further comprises a connecting part;

one end of the connecting part is connected with the casing while the other end is connected with the cap part, and the cap part covers the plug by insertion, socket or slide connection;

wherein:

the connecting part is a guide rod, one end of the guide rod is connected with the casing, the other end of the guide rod is connected with the cap part through the guide slot defined on a side of the cap part or inside the cap part, and the cap part slides along the guide rod to cover the plug.

2. The data card according to claim 1, wherein:

the card slot is for receiving a Subscriber Identity Model Card (SIM Card).

3. The data card according to claim 2, wherein:
the card slot is electrically connected with the circuit board, and the circuit board reads the data information of the SIM Card through the card slot.

4. The data card according to claim 2, wherein:
the plug is a Universal Serial BUS (USB) plug.

* * * * *